(12) United States Patent
Sekido et al.

(10) Patent No.: US 10,485,117 B2
(45) Date of Patent: Nov. 19, 2019

(54) ELECTRICAL JUNCTION BOX

(71) Applicant: Sumitomo Wiring Systems, Ltd., Yokkaichi, Mie (JP)

(72) Inventors: Toshihisa Sekido, Mie (JP); Takato Fujiki, Mie (JP); Katsuya Ito, Mie (JP); Takeshi Nozaki, Mie (JP); Takayuki Taniguchi, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/520,706

(22) PCT Filed: Oct. 27, 2015

(86) PCT No.: PCT/JP2015/080270
§ 371 (c)(1),
(2) Date: Apr. 20, 2017

(87) PCT Pub. No.: WO2016/068140
PCT Pub. Date: May 6, 2016

(65) Prior Publication Data
US 2017/0318696 A1     Nov. 2, 2017

(30) Foreign Application Priority Data

Oct. 28, 2014   (JP) ................................ 2014-219335

(51) Int. Cl.
*H05K 5/00*     (2006.01)
*H02G 3/16*     (2006.01)
(Continued)

(52) U.S. Cl.
CPC ........... *H05K 5/0026* (2013.01); *H02G 3/081* (2013.01); *H02G 3/16* (2013.01); *H05K 5/006* (2013.01);
(Continued)

(58) Field of Classification Search
CPC ...... H05K 5/0026; H05K 7/142; H05K 5/006; H02G 3/081; H02G 3/16; H02G 3/14;
(Continued)

(56) References Cited

U.S. PATENT DOCUMENTS 4,824,398 A * 4/1989 Taylor ................ H01R 13/6595
439/557
5,378,172 A * 1/1995 Roberts .................. H01R 24/64
439/607.26

(Continued)

FOREIGN PATENT DOCUMENTS

JP     H4-072686 U     6/1992
JP     2011019375 A     1/2011
JP     2013229414 A     11/2013

*Primary Examiner* — Steven T Sawyer
*Assistant Examiner* — Sagar Shrestha
(74) *Attorney, Agent, or Firm* — Honigman LLP

(57) ABSTRACT

An electrical junction box can include a case, a substrate connector, and a substrate. The substrate is temporarily fixed and soldered to the substrate connector. The substrate connector and the substrate are stored in the case. The substrate connector includes a pair of shaft-shaped temporary fixing protrusions. Each of the temporary fixing protrusions includes a positioning shaft that positions the substrate and a temporary fixing shaft that prevents the temporary fixing protrusions from coming loose from the substrate. The temporary fixing protrusions can be fitted into fitting holes in the substrate.

1 Claim, 4 Drawing Sheets

(51) Int. Cl.
*H02G 3/08* (2006.01)
*H05K 7/14* (2006.01)
*B60R 16/023* (2006.01)
*H02G 3/14* (2006.01)

(52) U.S. Cl.
CPC .......... *H05K 7/142* (2013.01); *B60R 16/0239* (2013.01); *H02G 3/086* (2013.01); *H02G 3/14* (2013.01)

(58) Field of Classification Search
CPC .. H02G 3/086; H01R 12/7017; H01R 12/523; H01R 12/7023; B60R 16/0239
USPC ................................................ 439/567, 557
See application file for complete search history.

(56) References Cited

U.S. PATENT DOCUMENTS

| | | | | |
|---|---|---|---|---|
| 5,613,877 A * | 3/1997 | Patel | ............ | H01R 12/7023 439/567 |
| 5,697,812 A * | 12/1997 | Sampson | ............ | H01R 12/7023 439/557 |
| 5,820,387 A * | 10/1998 | Borisch | ............ | H01R 12/724 439/326 |
| 5,980,314 A * | 11/1999 | Roberts | ............ | H01R 12/7023 439/567 |
| 6,565,383 B1 * | 5/2003 | Wu | ............ | H01R 12/7023 439/358 |
| 6,589,077 B1 * | 7/2003 | Wu | ............ | H01R 12/7029 439/567 |
| 6,994,577 B2 * | 2/2006 | Margulis | ............ | H01R 13/6315 439/247 |
| 7,500,872 B2 * | 3/2009 | Takahashi | ............ | H01R 12/7029 439/567 |
| 2002/0081900 A1 * | 6/2002 | Yu | ............ | H01R 12/7029 439/567 |
| 2003/0153209 A1 * | 8/2003 | Weidner | ............ | H01R 23/6873 439/567 |
| 2007/0173114 A1 * | 7/2007 | Takahashi | ............ | H01R 12/7017 439/567 |
| 2007/0197059 A1 * | 8/2007 | Tanaka | ............ | H01R 12/7017 439/79 |
| 2011/0083893 A1 * | 4/2011 | Honda | ............ | H05K 3/301 174/260 |
| 2012/0134130 A1 | 5/2012 | Washihira et al. | | |
| 2013/0286606 A1 * | 10/2013 | Watanabe | ............ | H05K 7/1417 361/752 |
| 2014/0017914 A1 * | 1/2014 | Endo | ............ | H01R 12/7082 439/81 |
| 2015/0011114 A1 * | 1/2015 | Endo | ............ | H01R 13/58 439/449 |
| 2015/0064940 A1 * | 3/2015 | Mukunoki | ............ | H01R 12/7005 439/65 |
| 2015/0118871 A1 * | 4/2015 | Yagi | ............ | H01R 12/523 439/65 |

* cited by examiner

ELECTRICAL JUNCTION BOX

CROSS-REFERENCE TO RELATED APPLICATIONS

This application is the U.S. national stage of PCT/JP2015/080270 filed Oct. 27, 2015, which claims priority of Japanese Patent Application No. JP 2014-219335 filed Oct. 28, 2014.

TECHNICAL FIELD

The present invention relates to an electrical junction box that is mounted to a vehicle.

BACKGROUND

Electrical junction boxes that are installed in vehicles are provided between a battery and various loads and supply power supplied from the battery to various loads via relays or fuses.

There are electrical junction boxes that are configured to house a plurality of relays inside a case. In these electrical junction boxes, by housing a plurality of relays mounted on a substrate inside a case, and connecting a substrate connector connected to the substrate to a corresponding connector in a relay box, the relays are interposed between the battery and loads.

In assembling such an electrical junction box, in a state where a substrate connector of the electrical junction box has been temporarily fixed to the substrate to which the relays have been mounted, the relays and the substrate connector are soldered to the substrate with the back surface of the substrate, which is opposite to the relay side, immersed in a solder tank, and the substrate is fixed to the substrate connector. Then, the substrate and the substrate connector are stored inside a case, and the substrate connector is fixed so as to be exposed through an opening in the case.

In an electrical junction box such as that described above, in order to prevent soldering failure, the substrate needs to be temporarily fixed in a state where it is accurately positioned on the substrate connector. Thus, in the relay module disclosed in JP 2011-19375A 1, a screw for temporary fixing is used to fix the substrate to the substrate connector.

As with the relay module disclosed in JP 2011-19375A 1, in a configuration in which a screw is used to temporarily fix the substrate to a connector, screw fastening work needs to be performed in a temporary fixing step and a screw is required, and thus there are the issues of the number of parts increasing and the manufacturing cost increasing.

SUMMARY OF INVENTION

An object of the present invention is to provide an electrical junction box with which a step of temporarily fixing a substrate is simplified, and the number of parts can be reduced.

An electrical junction box according to an aspect of the present invention is assembled by temporarily fixing and soldering a substrate to a substrate connector, and storing the substrate connector and the substrate in a case, the electrical junction box including: a temporary fixing protrusion that is a shaft-shaped temporary fixing protrusion provided on the substrate connector, and includes a positioning shaft that positions the substrate and a temporary fixing shaft that prevents the temporary fixing protrusion from coming loose from the substrate; and a fitting-target portion to which the temporary fixing protrusion can be fitted, provided on the substrate.

With this configuration, when the temporary fixing protrusion is fitted to the fitting-target portion, the substrate is positioned on the substrate connector and temporarily fixed.

It is preferable that the substrate connector includes a base portion that is made of a synthetic resin, is provided integrally with the temporary fixing protrusion, and is elastic, and a splitting groove is formed between the positioning shaft and the temporary fixing shaft of the temporary fixing protrusion.

With this configuration, when the temporary fixing protrusion is fitted to the fitting-target portion, the substrate is positioned on the substrate connector by the positioning shaft, and the substrate is temporarily fixed to the substrate connector by the temporary fixing shaft.

Also, it is preferable that, in the above-described electrical junction box, a pair of the temporary fixing protrusions are provided such that a pair of positioning shafts and temporary fixing shafts are arranged symmetrically to each other with respect to a virtual intermediate plane between the pair of temporary fixing protrusions.

With this configuration, the substrate is positioned on the substrate connector by the positioning shaft.

It is preferable that the positioning shaft is a shaft with a semi-circular cross-sectional shape that includes a reduced-diameter tip portion, and the temporary fixing shaft is a shaft with a semi-circular cross-sectional shape that includes an enlarged-diameter portion at a tip thereof.

With this configuration, when the temporary fixing protrusion is fitted to the fitting-target portion, the substrate is positioned on the substrate connector by the positioning shaft with a cross-sectional semi-circular shape abutting against the inner edge of the fitting-target portion, and the substrate is temporarily fixed to the substrate connector by the enlarged-diameter portion of the temporary fixing shaft abutting against the inner edge of the fitting-target portion.

It is preferable that the fitting-target portion includes a fitting hole, a radius from an axial center of the temporary fixing protrusion to an outer circumferential surface of a base end portion of the positioning shaft is the same as a radius of the fitting hole, and a radius from the axial center of the temporary fixing protrusion to a crown portion of the enlarged-diameter portion of the temporary fixing shaft is larger than the radius of the fitting hole.

With this configuration, when the temporary fixing protrusion is fitted into a fitting hole, the substrate is positioned on the substrate connector by the positioning shaft abutting against the inner edge of the fitting hole, and the substrate is temporarily fixed to the substrate connector by the enlarged-diameter portion of the temporary fixing shaft abutting against the inner edge of the fitting hole.

With the electrical junction box of the present invention, the step of temporarily fixing the substrate is simplified, and the number of parts can be reduced. Other facets and advantages of the present invention will be made clear from the drawings showing examples of technical concepts of the present invention and that disclosed below.

DETAILED DESCRIPTION OF THE PREFERRED EMBODIMENTS

Hereinafter, an embodiment of a relay module (electrical junction box) will be described using the drawings. In the relay module shown in FIGS. 1 and 2, a base end portion of a substrate connector 2 is exposed at the opening of a rectangular parallelepiped case 1 that is made of a synthetic resin, and can be fitted to a connector of a relay box via the substrate connector 2.

Figure 3:
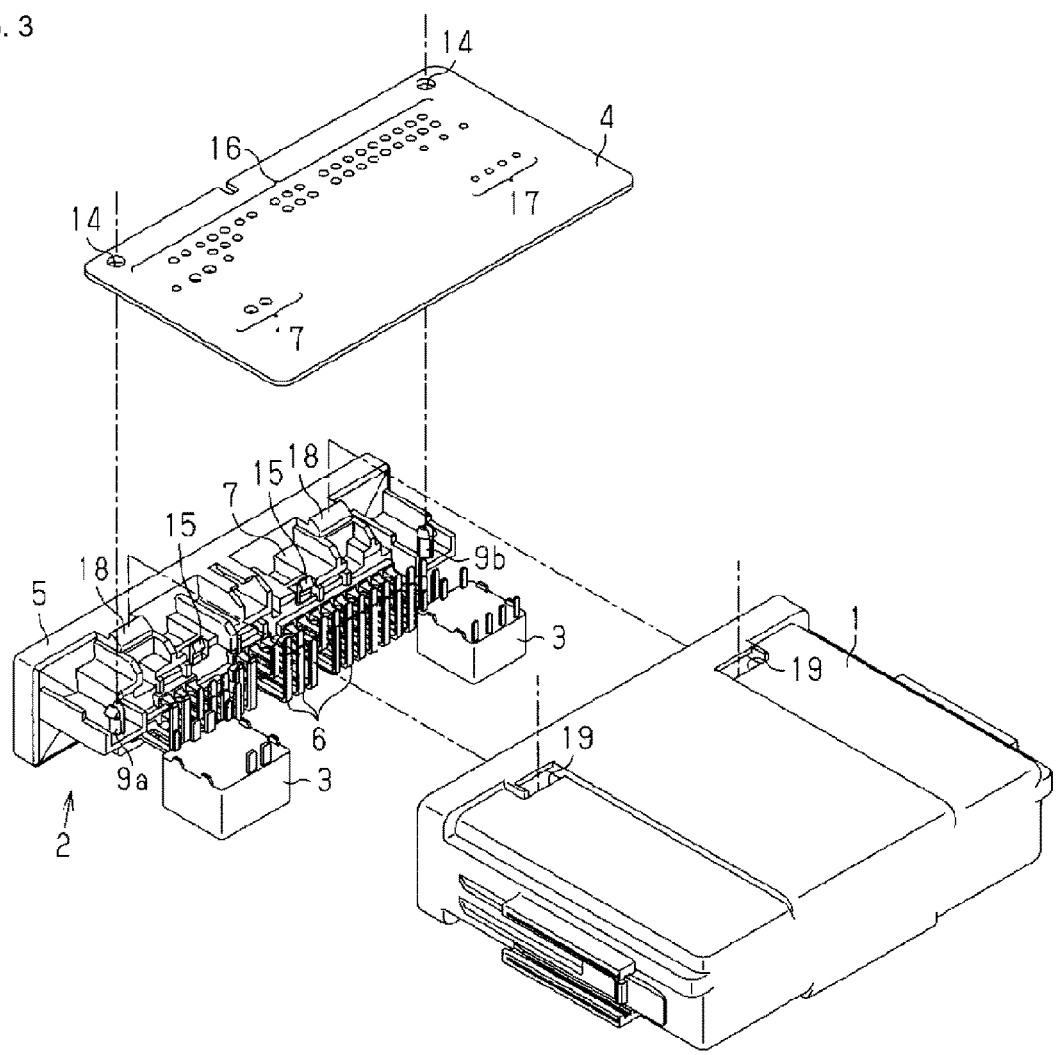
FIG. 3 is an exploded perspective view of the electrical junction box.

As shown in FIG. 3, a substrate 4 onto which a plurality of relays 3 that are electronic parts are mounted and the substrate connector 2 to which the substrate 4 is attached are stored inside the case 1. The substrate connector 2 is pierced by and holds the base end portions of a plurality of connection pins 6 that have been bent into an L shape, at a base portion 5 that is made of a synthetic resin. The connection pins 6 are made of metal and are electrically conductive.

The base portion 5 is a part that is made of a synthetic resin and has an integrally formed holding portion 7 that has a rectangular parallelepiped shape that enables insertion and fitting to the opening of the case 1. In a state where the base portion 5 has been inserted and fitted to the case 1, the holding portion 7 protrudes inward of the case 1. The holding portion 7 holds the plurality of connection pins 6 that are arranged in two rows in the longitudinal direction of the base portion 5 piercing the holding portion 7.

Figure 1:
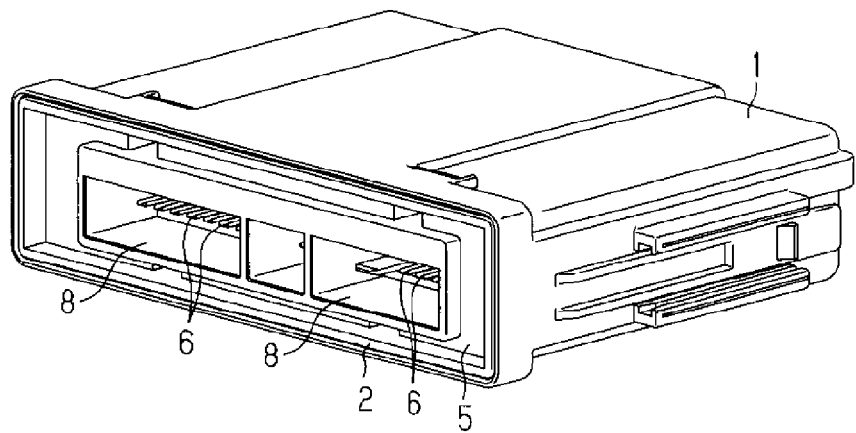
FIG. 1 is a perspective view of an electrical junction box according to an embodiment.
Figure 2:
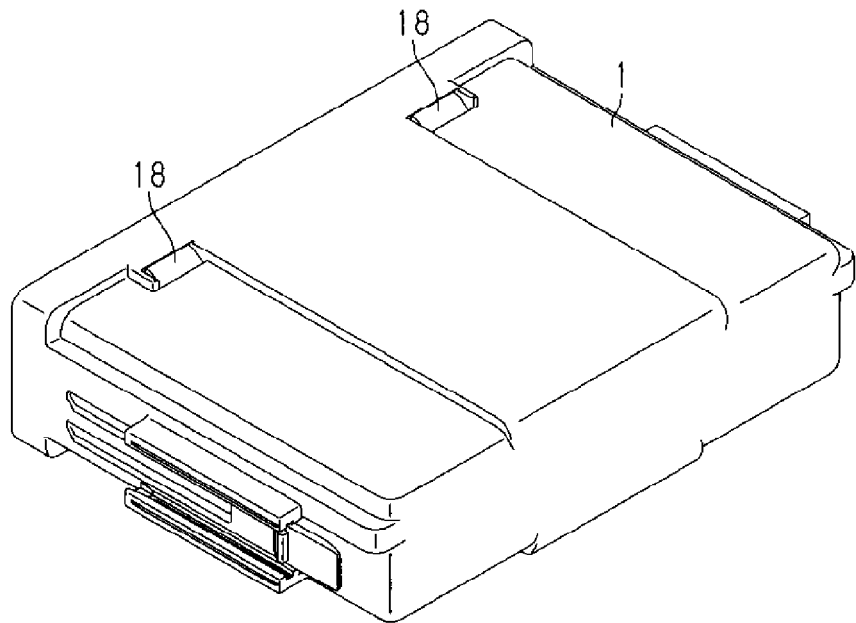
FIG. 2 is a perspective view of the electrical junction box according to the embodiment.

As shown in FIG. 1, the base portion 5 has fitting cavities 8 to which a connector of the relay box can be fitted, on the front face that is exposed from the opening of the case 1. The base end portions of the connection pins 6 are exposed in the fitting cavities 8. Each tip portion of the connection pins 6 is bent at a right angle in the height direction of the case 1 to form an L-shape. The middle portions of the connection pins 6 are embedded in the base portion 5.

Figure 4:
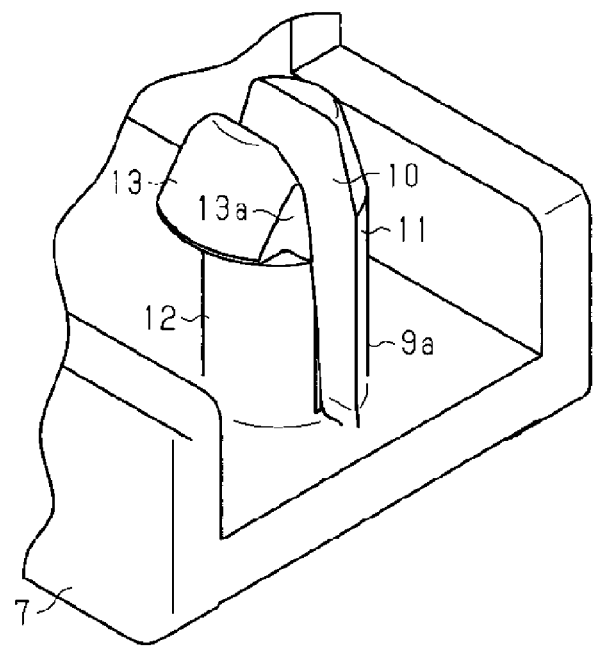
FIG. 4 is a perspective view of a temporary fixing protrusion.

A pair of shaft-shaped temporary fixing protrusions 9a and 9b protruding in the same direction as the tip portions of the connection pins 6 are formed at both end portions of the holding portion 7 and positioned at the same distance from the base portion 5. As shown in FIG. 4, the temporary fixing protrusions 9a and 9b are split by a splitting groove 10 that splits the temporary fixing protrusions 9a and 9b in the longitudinal direction of the base portion 5, into a positioning shaft 11 and a temporary fixing shaft 12.

As shown in FIG. 3, the positioning shaft 11 and the temporary fixing shaft 12 corresponding to the temporary fixing protrusion 9a and the positioning shaft 11 and the temporary fixing shaft 12 corresponding to the temporary fixing protrusion 9b may be symmetrical to each other with respect to a virtual intermediate plane between the temporary fixing protrusions 9a and 9b. In this embodiment, the positioning shafts 11 of the temporary fixing protrusions 9a and 9b are formed inward of the temporary fixing shafts 12 and face each other in the longitudinal direction of the base portion 5.

The positioning shafts 11 are shafts with a semi-circular cross-sectional shape that is obtained by cutting a circular shaft with a gradually narrowing tip portion into two down the center along the axial direction thereof. Also, the temporary fixing shafts 12 are shafts with a semi-circular cross-sectional shape that is obtained by cutting a circular shaft that includes a wedge-shaped enlarged-diameter portion 13 at the tip thereof into two down the center along the axial direction thereof.

The radius of the enlarged-diameter portion 13, that is, the maximum radius from an axial center 9x of the temporary fixing protrusions 9a and 9b to the outermost position, i.e. the crown portion of the enlarged-diameter portion 13, is larger than the radius from the axial center 9x of the temporary fixing protrusions 9a and 9b to the outer circumferential surface of the base end portion of the positioning shaft 11.

Also, the radius from the axial center 9x of the temporary fixing protrusions 9a and 9b to the outer circumferential surface of the base end portion of the temporary fixing shaft 12 is smaller than the radius from the axial center 9x of the temporary fixing protrusions 9a and 9b to the outer circumferential surface of the base end portion of the positioning shaft 11. Note that two end portions 13a in the circumferential direction of the enlarged-diameter portion 13 are cut off to form planar shapes, and the temporary fixing shafts 12 can easily fit into later-described fitting-target portions of the substrate 4.

As shown in FIG. 3, a pair of fitting holes 14 that allow insertion and fitting of the temporary fixing protrusions 9a and 9b are formed at either corner on one edge of the substrate 4. The fitting holes 14 are examples of the fitting-target portions. The diameter of the fitting holes 14 is formed to be equal to that of a diameter were the base end portion of the positioning shaft 11 of the temporary fixing protrusions 9a and 9b to be in the shape of a circular shaft.

Figure 5:
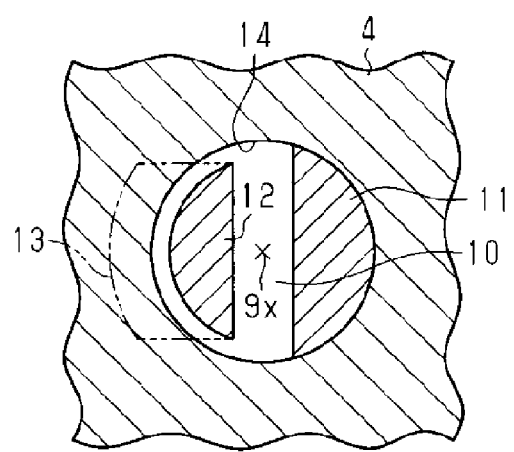
FIG. 5 is a cross-sectional diagram of the temporary fixing protrusion fitted into a fitting hole.

Accordingly, when the temporary fixing protrusions 9a and 9b are being inserted into the fitting holes 14, the temporary fixing shaft 12 penetrates therethrough while the enlarged-diameter portion 13 abuts against the inner edge of the fitting holes 14 and flexes toward the positioning shaft 11. Then, when the enlarged-diameter portion 13 passes over the inner edge of the fitting hole 14, as shown in FIG. 5, the substrate 4 is positioned on the substrate connector 2 by the positioning shaft 11 abutting against the inner edge of the fitting hole 14, and the substrate 4 is temporarily fixed to the substrate connector 2 by the temporary fixing shaft 12.

Lean prevention pieces 15 that protrude in the same direction as the temporary fixing protrusions 9a and 9b are formed protruding between the temporary fixing protrusions 9a and 9b on the holding portion 7. The lean prevention pieces 15 engage with an edge of the substrate 4 when the temporary fixing protrusions 9a and 9b are fitted into the fitting holes 14 of the substrate 4, and have the function of holding the substrate 4 so that it does not lean relative to the substrate connector 2.

A plurality of insertion holes 16 that allow insertion of the tips of the connection pins 6 and a plurality of insertion holes 17 that allow insertion of the connection terminals of the relays 3 are formed in the substrate 4. The insertion holes 16 are formed at positions at which the connection pins 6 can be inserted at the time when the temporary fixing protrusions 9a and 9b are being fitted into the fitting holes 14 of the substrate 4.

The base portion 5 of the substrate connector 2 is provided with pairs of engaging protrusions 18 that protrude up and down, and engaging holes 19 that the engaging protrusions 18 can engage with are provided near the opening of the case 1.

Then, when the substrate connector 2 attached to the substrate 4 is inserted into the case 1, and the engaging protrusions 18 are engaged with the engaging holes 19, the substrate 4 and the substrate connector 2 are stored in the case 1. In this state, the base end portions of the connection pins 6 of the substrate connector 2 are exposed at the opening of the case 1, and can be connected to the connector of the relay box.

Next, the procedure of assembling a relay module such as that above and the effects thereof will be described.

First, the relays 3 are attached to the surface (also referred to as "element mounting surface") of the substrate 4, and then the temporary fixing protrusions 9a and 9b are fitted into the fitting holes 14 of the substrate 4. Then, the substrate 4 is positioned on the substrate connector 2, and the tips of the connection pins 6 of the substrate connector 2 are automatically inserted and fitted into the insertion holes 16 of the substrate 4.

Specifically, the substrate 4 is positioned on the substrate connector 2 by the positioning shafts 11 abutting against the inner edge of the fitting holes 14, the substrate 4 is temporarily fixed to the substrate connector 2 by the enlarged-diameter portions 13 of the temporary fixing shafts 12, and the tips of the connection pins 6 of the substrate connectors 2 are automatically inserted and fitted into the insertion holes 16.

In this state, the tips of the connection terminals of the relays 3 and the back surface (also referred to as "non-mounting surface") of the substrate 4, at which the tips of the connection pins 6 are exposed, are submerged in a solder tank, and solder processing is performed. In doing so, the substrate 4 is fixed to the substrate connector 2, and the relays 3 on the substrate 4 are electrically connected to the connection pins 6.

Then, the substrate 4 is inserted into the opening of the case 1 from the free end of the substrate 4. When the engaging protrusions 18 of the substrate connector 2 are engaged with the engaging holes 19 of the case 1, assembly of the relay module is complete. This relay module is mounted to a relay box.

In a relay module such as that described above, the following effects can be obtained.

(1) By fitting the temporary fixing protrusions 9a and 9b to the fitting holes 14 of the substrate 4, the substrate 4 can be positioned on the substrate connector 2 and can be temporarily fixed.

(2) By fitting the pair of temporary fixing protrusions 9a and 9b into the corresponding fitting holes 14, the substrate 4 is positioned on the substrate connector 2 by the positioning shafts 11 of the temporary fixing protrusions 9a and 9b, and the substrate 4 is temporarily fixed to the substrate connector 2 by the temporary fixing shafts 12 of the temporary fixing protrusions 9a and 9b.

(3) Positioning and temporary fixing can be performed by using the temporary fixing protrusions 9a and 9b integrally formed on the base portion 5 of the substrate connector 2 and the engaging holes 14 formed in the substrate 4 without using a screw, and thus the number of parts can be reduced.

(4) The step of fastening with a screw to temporarily fix the substrate 4 can be omitted.

(5) The substrate 4 can be accurately positioned on the substrate connector 2 and be temporarily fixed, and thus the yield by weight of the soldering step, which is a following step, can be improved.

(6) The base portion 5 including the temporary fixing protrusions 9a and 9b is a single part that is made of a synthetic resin. With this configuration, separate parts that differ from the base portion 5 such as screws and clips for temporarily fixing the substrate 4 to the substrate connector 2 are not required.

(7) The positioning shafts 11 and the temporary fixing shafts 12 can easily flex inside the fitting hole 14 of the substrate 4 due to the splitting grooves 10. The temporary fixing shafts 12 of the temporary fixing protrusions 9a and 9b can bias, in directions away from each other, the substrate 4 in the longitudinal direction of the base portion 5 when they are fitted into the fitting holes 14.

(8) The temporary fixing protrusions 9a and 9b, the connection pins 6, and the connection terminals of the relays 3 protrude in the same direction. With this configuration, the temporary fixing protrusions 9a and 9b, the connection pins 6, and the connection terminals of the relays 3 can be inserted into the corresponding holes 14, 16, and 17 respectively in the substrate 4 from the same side (e.g. element mounting side) of the substrate 4. Accordingly, the electrical junction box can be easily assembled.

(9) As shown in FIG. 3, it is preferable that the temporary fixing protrusions 9a and 9b of the base portion 5 only engage with the substrate 4 at the fitting holes 14 near the base end edge of the substrate 4, and the front end edge on the opposite side of the substrate 4 is a free end. With this configuration, the size of the substrate connector 2 can be reduced.

(10) As shown in FIG. 3, it is preferable that the enlarged-diameter portions 13 of the temporary fixing shafts 12 protrude in directions away from each other. With this configuration, the temporary fixing shafts 12 of the temporary fixing protrusions 9a and 9b can bias, in directions away from each other, the substrate 4 in the longitudinal direction of the base portion 5 when they are fitted into the fitting holes 14 of the substrate 4.

(11) It is preferable that each of the connection pins 6 are individual electrically conductive parts that have a base end portion located inside the fitting cavity 8, a tip portion that protrudes in the same direction as the temporary fixing protrusions 9a and 9b, and a middle portion embedded in the base portion 5. With this configuration, the connector of the relay box and the substrate 4 can be directly and electrically connected to each other via the connection pins 6, and the number of electrically conductive parts included in the electrical conduction path from the fitting cavities 8 to the substrate 4 can be reduced.

Note that the above-described embodiment may be modified in the following ways.

In the above-described embodiment, the positioning shafts 11 of the temporary fixing protrusions 9a and 9b are located on the inner side and the temporary fixing shafts 12 are located on the outer side, but the positioning shafts 11 may be located on the outer side.

Figure 6:
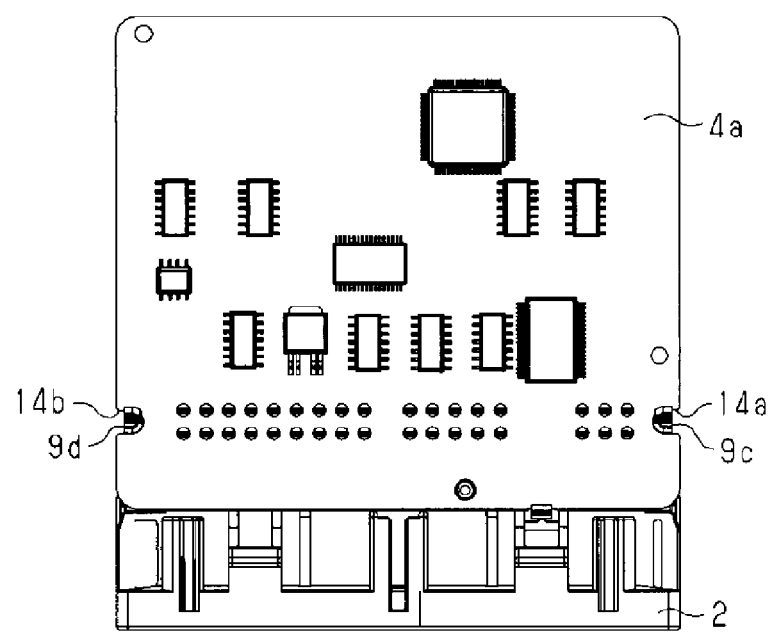
FIG. 6 is a plan view for illustrating fitting between a fitting-target portion and a temporary fixing protrusion according to a variation.

The fitting-target portions are not limited to the fitting holes 14, and may be cut-outs. For example, as shown in the variation in FIG. 6, cut-outs 14a and 14b are provided in a substrate 4a as the fitting-target portions. There is no limit to this, but the cut-outs 14a and 14b can be open on opposing edges of the substrate 4a. In this example, the substrate connector 2 includes the cut-outs 14a and 14b of the substrate 4a and temporary fixing protrusions 9c and 9d that are to be fitted thereto respectively. Similar to the temporary fixing protrusions 9a in FIG. 4, each of the temporary fixing protrusion 9c and 9d can include a positioning shaft 11 and a temporary fixing shaft 12. There is no limit to this, but each of the temporary fixing protrusion 9c and 9d may have the structure of that of the temporary fixing protrusion 9a in FIG. 4 having been rotated clockwise or anti-clockwise for a predetermined rotation angle (e.g. 90 degrees) around the axial center 9x thereof.

The fitting-target portions may include fitting holes and cut-outs.

The present invention is not limited to that illustrated. For example, illustrated features are not to be interpreted as being essential to the present invention, and the subject matter of the present invention may exist with fewer features than those of the specified embodiments thus disclosed.

The invention claimed is:

1. An electrical junction box comprising:
   a substrate;
   a substrate connector including a base portion that is made of a synthetic resin;
   a case;
   a pair of temporary fixing protrusions integrally formed to the substrate connector and disposed on opposing sides of the substrate connector, the pair of the temporary fixing protrusions are arranged symmetrically to each other with respect to a virtual intermediate plane between the pair of temporary fixing protrusions, each of the pair of temporary fixing protrusions being elastic and including:
     a positioning shaft having a conical end being smaller in diameter than a base of the positioning shaft so as to form a reduced-diameter tip portion; and
     a temporary fixing shaft spaced apart from the positioning shaft, the temporary fixing shaft has a semicircular cross-section so as to present a planar surface along an interior surface of the temporary fixing shaft, the temporary fixing shaft having a base end portion and an enlarged-diameter portion at a tip thereof, the base end portion having a constant radius;
   a splitting groove is formed between the positioning shaft and the temporary fixing shaft of the temporary fixing protrusion;
   wherein each of the positioning shafts is disposed interior of the substrate connector relative to the temporary fixing shaft so as to place each of the temporary fixing shafts on a peripheral side of the substrate connector, the positioning shaft positions the substrate; and
   a fitting-target portion to which the temporary fixing protrusion can be fitted is provided on the substrate, the fitting-target portion is a fitting hole and a radius from an axial center of the temporary fixing protrusion to an outer circumferential surface of the base end portion of the positioning shaft is the same as a radius of the fitting hole, and a radius of the base end portion of the temporary fixing shaft is smaller than the fitting hole, and a radius of the temporary fixing shaft from the axial center of the temporary fixing protrusion to a crown portion of the enlarged-diameter portion of the temporary fixing shaft is larger than the radius of the fitting hole wherein the electrical junction box is assembled by temporarily fixing and soldering the substrate to the substrate connector and storing the substrate connector and the substrate in the case.

* * * * *